United States Patent
Tanda et al.

(10) Patent No.: US 7,374,817 B2
(45) Date of Patent: May 20, 2008

(54) TOPOLOGICAL CRYSTAL OF TRANSITION METAL CHALCOGENIDE AND METHOD OF FORMING THE SAME

(75) Inventors: Satoshi Tanda, Sapporo (JP); Taku Tsuneta, Sapporo (JP); Yoshitoshi Okajima, Sapporo (JP); Katsuhiko Inagaki, Sapporo (JP); Kazuhiko Yamaya, Sapporo (JP); Noriyuki Hatakenaka, Atsugi (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 205 days.

(21) Appl. No.: 10/535,450

(22) PCT Filed: May 20, 2003

(86) PCT No.: PCT/JP03/06282

§ 371 (c)(1),
(2), (4) Date: Dec. 7, 2005

(87) PCT Pub. No.: WO2004/048647

PCT Pub. Date: Jun. 10, 2004

(65) Prior Publication Data

US 2006/0124048 A1   Jun. 15, 2006

(30) Foreign Application Priority Data

Nov. 22, 2002   (JP) .............................. 2002-340094

(51) Int. Cl.
*B32B 15/01* (2006.01)
(52) U.S. Cl. .................... 428/446; 117/68; 117/75; 423/328.2
(58) Field of Classification Search ........... 117/68, 117/75; 423/328.2; 428/446
See application file for complete search history.

(56) References Cited

U.S. PATENT DOCUMENTS

2002/0117467 A1   8/2002   Tanda et al.

FOREIGN PATENT DOCUMENTS

JP   2002-255699   9/2002

OTHER PUBLICATIONS

Satoshi Tanda et al.; "A Möbius strip of single crystals", Nature, vol. 417, pp. 397-398, May 23, 2002. Cited in the enclosed international search report.
Satoshi Tanda et al.; "Topological Bushitsu, Solid state physics", vol. 37, No. 8, pp. 17-26. Aug. 15, 2002. Cited in the enclosed international search report.

*Primary Examiner*—Felisa Hiteshew
(74) *Attorney, Agent, or Firm*—Westerman, Hattori, Daniels & Adrian, LLP.

(57) ABSTRACT

Disclosed is a transition-metal chalcogenide crystal having a topological configuration/structure. A micro-droplet of a chalcogen element, such as S, Se or Te, is condensed and circulated in suspended form in an atmosphere containing a Group IVb, Vb or VI transition metal element, such as Nb, Ta, Zr, Ti, Hf or W, together with the chalcogen element. Then, micro-whiskers of a transition metal chalcogenide formed in the atmosphere are attached onto a surface of the chalcogen-element micro-droplet by the action of a surface tension of the micro-droplet, and grown as a loop-shaped crystal wound around the surface of the micro-droplet to obtain a loop-shaped crystal having a twist of 0, $\pi$ or $2\pi$. The crystal has a ribbon-like open or closed loop configuration. The transition-metal chalcogenide crystal with the topological loop-shaped microstructure can exhibit original properties peculiar to each transition-metal chalcogenide, and has applicability, for example, to a quantum device, such as SQUID.

8 Claims, 2 Drawing Sheets

TOPOLOGICAL CRYSTAL OF TRANSITION METAL CHALCOGENIDE AND METHOD OF FORMING THE SAME

TECHNICAL FIELD

The present invention relates to a material consisting of a transition-metal chalcogenide crystal and having a loop-shaped microstructure, and to a technology allowing the material to be used for various purposes, such as electromagnetic measuring devices, based on peculiar properties thereof.

BACKGROUND ART

A transition-metal chalcogenide material $MX_3$, which is a compound of a Group Ivb or Vb transition metal element, such as Zr, Nb or Ta, and a chalcogen element, such as S, Se or Te, has a crystal structure which comprises a fundamental unit consisting of a triangle pole formed of six chalcogen atoms and a metal atom located at the center thereof, wherein chains of respective triangle poles are built up parallel to each other. This structure provides various materials exhibiting peculiar properties rarely seen in other conventional materials. Typically, such materials include $TaSe_3$ exhibiting superconductivity with a strong anisotropy, $TaS_3$ exhibiting a Peierls transition, and $NbSe_3$ exhibiting a CDW (Charge Density Wave) transition. Therefore, vigorous researches are being promoted to explore the properties and develop applications thereof Further, great interest is shown in properties of a transition-metal dichalcogenide based on its low-dimensional structure, and applications thereof.

In connection with these researches, the inventors previously succeeded in forming ring-shaped crystalline microstructures of a transition-metal dichalcogenide $MX_2$ and a transition-metal trichalcogenide $MX_3$.

[Prior Art Document]
  Patent Publication: Japanese Patent Laid-Open Publication No. 2002-255699

These crystalline microstructures or microcrystals can maintain a crystal structure unique to each chalcogenide in the ring-shaped microstructure thereof to exhibit original properties unique to each chalcogenide based on its low-dimensional structure. Thus, these microcrystals are expected as a material applicable to a superconducting quantum interference device (SQUID) by taking advantage of superconductivity and configuration/structure thereof. Further, this technology can realize a ring-shaped microstructure having a diameter of 0.1 to 10 μm and a line width of about 10 nm which could not be achieved by photolithography as a conventional microfabrication technique, and allows properties of each chalcogenide to be achieved in a topological macrostructure necessary for various devices. Therefore, various applied researches are being made to utilize such properties and structures for various potential purposes, such as biomagnetism measurement.

As above, researches on the peculiar properties of chalcogenides are made in various sectors. Such applications of the properties are based on the premise of verification of the properties and development of handling technologies, such as forming technologies, for achieving various configurations/structures. In particular, it is desirable that the microstructure is created during the course of physically forming the crystal, and formed as a topological structure maintaining its original properties in a self-aligning manner, as in the ring-shaped microcrystal previously proposed by the inventors. This process allows an obtained microcrystal to maintain original properties unique to each chalcogenide.

The transition-metal chalcogenide material, such as transition-metal trichalcogenide or transition-metal dichalcogenide, is characterized by having low dimensionality, and thereby exhibits significant anisotropy in various properties thereof. Thus, what is required for utilizing these characteristics is to research the properties and develop a forming technique capable of coping with such anisotropy, specifically a topological shaping/forming method capable of maintaining topological properties of each transition-metal chalcogenide material in a macro configuration/structure necessary in actual use.

It is therefore an object of the present invention to provide a method capable of forming a transition-metal chalcogenide material having a topological micro configuration/structure while maintaining the crystal structure of a transition-metal trichalcogenide or dichalcogenide exhibiting the aforementioned peculiar properties to preserve the properties, and to provide a useful transition-metal chalcogenide crystal with a topological configuration/structure, having the original properties of the transition-metal trichalcogenide or dichalcogenide.

DISCLOSURE OF INVENTION

The present invention provides a method for forming a transition-metal chalcogenide crystal having a topological structure, which comprises growing a transition-metal chalcogenide crystal along a surface of a micro-droplet of a chalcogen element in an atmosphere containing either one of Group IVb, Vb and VIb transition metal elements together with the chalcogen element, in such a manner as to be formed as a loop-shaped crystal wound around the surface of the micro-droplet and having a twist of n π, wherein n is an integer number selected from 0, 1 and 2.

The above method may include maintaining the atmosphere in a given temperature range around a melting point of the chalcogen element and in a given temperature gradient, to allow the chalcogen-element micro-droplet to be condensed from the atmosphere, and circulating the chalcogen-element micro-droplet in a nonequilibrium state to allow micro-whiskers of a transition metal chalcogenide formed in the atmosphere to be attached onto the surface of the chalcogen-element micro-droplet by the action of a surface tension of the micro-droplet and grown as the loop-shaped crystal having a twist of n π, wherein n is an integer number selected from 0, 1 and 2.

In the above method, the loop-shaped crystal may have a ribbon-like open loop configuration or a closed loop configuration. The chalcogen element may be one selected from the group consisting of S, Se and Te, and the either one of Group IVb, Vb and VIb transition metal elements may be one selected from the group consisting of Nb, Ta, Zr, Ti, Hf and W.

The present invention also provides a crystal having a topological structure, which comprises chalcogenide containing either one of Group IVb, Vb and VIb transition metal elements, and has a loop configuration formed by using as a template a spherical surface of a droplet of a chalcogen element. The loop configuration has a twist of n π, wherein n is an integer number selected from 0, 1 and 2.

The above crystal may have a ribbon-like open loop configuration or a closed loop configuration.

In the above crystal, the chalcogen element may be one selected from the group consisting of S, Se and Te, and the either one of Group IVb, Vb and VIb transition metal elements may be one selected from the group consisting of Nb, Ta, Zr, Ti, Hf and W.

In the above crystal, the twist in the topological structure may be formed by a crystalline disclination.

According to the method of the present invention, when a crystal is grown from a starting or raw material by a chemical vapor transport process or the like, a transition-metal chalcogenide crystal is formed that typically has a very elongated ribbon-like/whisker-like configuration with a cross-section of several μm×1 μm and a length of several mm.

While this configuration has the properties peculiar to the transition-metal chalcogenide, various restrictions will be imposed on device applications due to the need for a 3-dimensional configuration/structure therein.

As disclosed in the aforementioned Patent Publication, the inventors proposed a technique of forming a ring-shaped crystal, and opened the way for utilizing the crystal in devices, such as SQUID. The inventors further made researches to simplify a process for forming the configuration/structure and to form a crystal capable of achieving topological functions in various configurations other than the ring shape.

Through the researches, the inventors found the following facts.

When a reaction between a transition-metal element, such as Nb, and a chalcogen element, such as selenium (Se), is induced by a chemical vapor transport process or the like under the conditions allowing a transition-metal chalcogenide to be formed, Se having a lower melting point is vaporized/condensed and circulated around an atmosphere in a reaction chamber, and $NbSe_3$ molecules formed through the reaction are localized and crystallized. Then, when the formed micro-whiskers of $NbSe_3$ are brought into contact with an adjacent droplet of selenium, they are attached onto a surface of the droplet by the action of a surface tension thereof.

In this manner, the $NbSe_3$ whiskers are crystal-grown while being spooled or wound around the surface of the droplet, and formed as a loop (see FIGS. 1a and 1b).

This loop consists of a strip-shaped single crystal. If the crystal growth is interrupted due to the conditions of the reaction, the loop will have an open loop configuration having opposite free ends. If the crystal growth is fully continued, the loop will have a closed loop configuration.

Then, the droplet serving as a support medium is eliminated, for example, by vaporizing the droplet, to obtain an independent loop-shaped crystal.

As above, the loop-shaped transition-metal chalcogenide crystal is formed by inducing the crystal growth along the surface of the Se droplet using the Se droplet as a template. Thus, the crystal growth is topologically developed along with the formation of the loop as a macrostructure, so that topological properties of the transition-metal chalcogenide can be maintained in the loop structure.

The loop-shaped crystal to be obtained includes a ring-shaped crystal grown simply along the droplet, a Mobius strip-shaped crystal having one twist, and a figure-of-eight or 8-shaped crystal formed by circulatingly growing the crystal along the surface of the droplet.

While the ring-shaped crystal is topologically a ring (cylinder), various configurations, such as a disc shape, a cylindrical column shape and a concentric cylinder shape, have been actually obtained.

Refer to FIGS. 2a to 2d showing scanning electron microscope (SEM) images of these crystals.

As shown in the lower portion of FIG. 3b which schematically illustrates a crystal growth mechanism of the Mobius strip-shaped crystal, during the crystal growth of the $NbSe_3$ crystal along the surface of the Se droplet, the $NbSe_3$ crystal has a twist by the action of the surface tension of the Se droplet (this principle may be explained with reference to the following theories on elasticity by Landau and Hermon). More specifically, if a twist of $\pi$ occurs just when the crystal is wound one time, the Mobius strip-shaped crystal will be formed.

[Prior Art Document]
Non-Patent Publication 1: Landau, L. D. and Lifshiftz, E. M., Theory of Elasticity., (PergamonPress, Oxford, 1959)
Non-Patent Publication 2: Hermon, R. F. S., An Introduction to applied anisotropic elasticity., (Oxford Univ. Press, London, 1961)

Further, if the crystal is formed after it is wound around the droplet two times, the 8-shaped crystal will be formed as schematically shown in FIG. 3c, and the loop will have a twist of $2\pi$.

The twist is obtained up to $3\pi$ or more depending on the number of spoolings or windings. Thus, the number of twists in the loop results in an integer number n of 0, 1 or 2 in a twist of $n\pi$.

The transition-metal chalcogenide crystal formed in the above manner typically had an outer diameter of 90 μm for the ring-shaped crystal and the Mobius strip-shaped crystal.

The 8-shaped crystal had an average circumference of 480 μm, which is about two times greater than that of the ring-shaped crystal. In either case, the size of the loop configuration of the crystal is determined by the size of the Se droplet serving as a template. Thus, it is expected that the conditions of the crystal formation can be controlled to obtain various sizes of crystals.

Then, these loop-shaped crystals were cut using a FIB (focused ion beam), and the level of plasticity to be caused by a bending deformation was evaluated.

As a result, it was proven that while a deformed shape is elastically recovered to a linear shape when the crystal has a thin loop, it is remained when the thickness of the thicker loop reaches 1 μm.

This means that the loop-shaped crystal can be regarded as a ring consisting of a fibrous perfect crystal of the micrometer scale, and has a discrete rotational symmetry which does not exist in a ring formed simply by carving a single crystal.

That is, each of the Mobius strip-shaped and 8-shaped crystals has a twist disclination of $\pi$ or $2\pi$, or a disclination line extends over the entire crystal structure.

While the above description has been made in connection with a trichalcogenide containing Se as a chalcogen element and Nb as a transition-metal element, the present invention may be applied to any other suitable trichalcogenide or dichalcogenide having intended properties and compatibility with the principle of crystal formation of the present invention. For example, in the trichalcogenide or dichalcogenide, the chalcogen element may be either one of S and Te, and the transition metal element may be one selected from the group consisting of Ta, Zr, Ti, Hf and W in either one of Group IVb, Vb and VIb transition metal elements.

As evidenced by the above mechanism of forming the crystal with a topological structure (hereinafter referred to occasionally as "topological crystal"), where the topological crystal is formed through the crystal growth of a transition-metal chalcogenide induced under the conditions that the transition-metal chalcogenide is coexistent with a droplet of the chalcogen element serving as a template, as long as these conditions are satisfied, the starting material and the reaction in a chemical vapor transport process or the like are not limited to a specific mode, form or pattern.

BRIEF DESCRIPTION OF DRAWINGS

FIGS. 1a and 1b are SEM photographs showing a process of forming an $NdSe_3$ topological crystal of the present invention, wherein FIG. 1a shows the state when $NdSe_3$ whiskers are attached onto a Se droplet by the action of its surface tension and wound around the Se droplet, and FIG. 1b shows the state when the whisker is twisted during the course of the attaching/winding.

FIGS. 2a to 2d are SEM photographs showing typical $NdSe_3$ topological crystals of the present invention, wherein FIGS. 2a, 2b, 2c and 2d show a ring-shaped crystal, a concentric cylinder-like ring-shaped crystal, a Mobius strip-shaped crystal and an 8-shaped crystal, respectively.

FIGS. 3a to 3c are model diagrams of a template growth of an $NdSe_3$ topological crystal of the present invention, wherein FIGS. 3a, 3b and 3c show a ring-shaped crystal/simple winding, a Mobius strip-shaped crystal/winding with twists, and an 8-shaped crystal/two-round winding, respectively.

BEST MODE FOR CARRYING OUT THE INVENTION

Figure 1A:
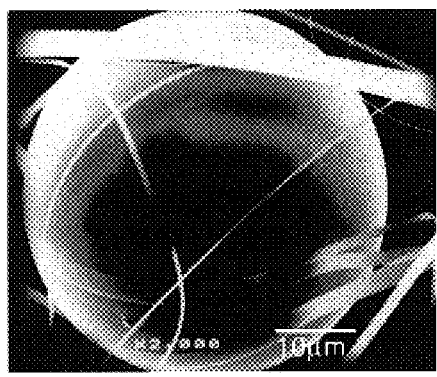
Figure 1B:
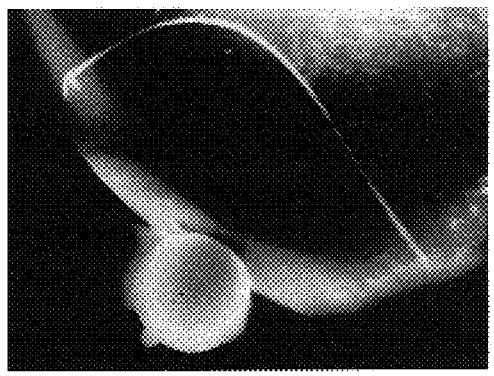
Figure 2A:
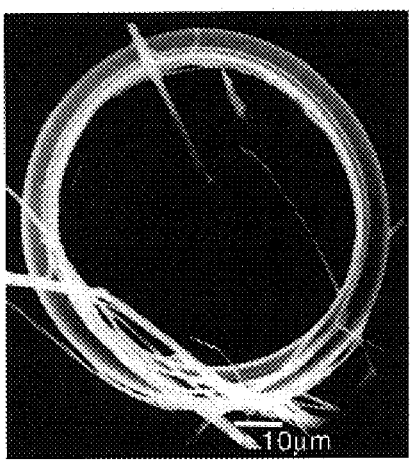
Figure 2B:
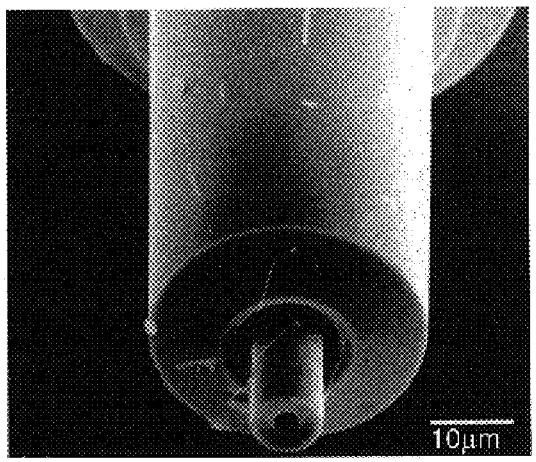
Figure 2C:
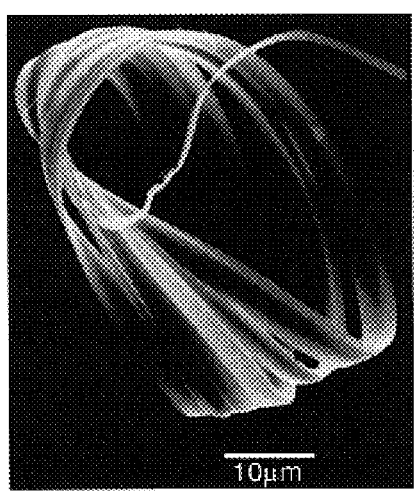
Figure 2D:
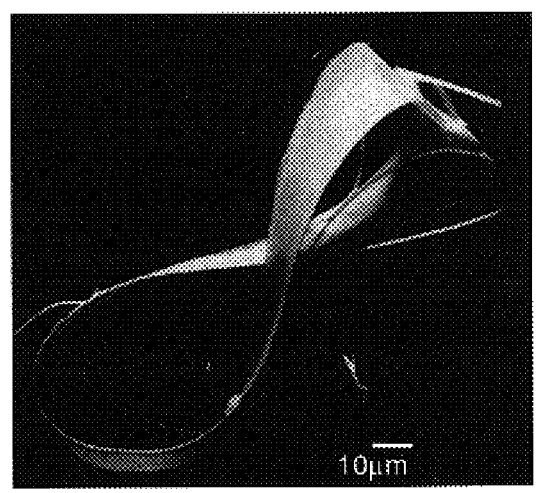
Figure 3A:
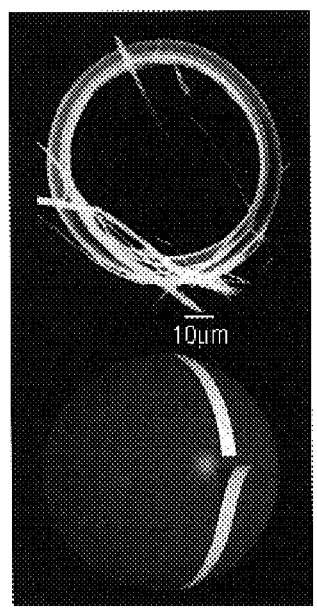
Figure 3B:
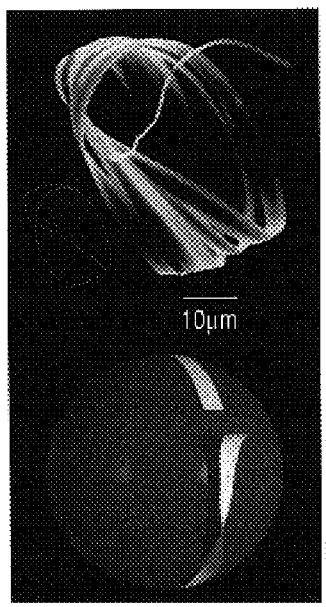
Figure 3C:

Specific conditions for forming a loop-shaped topological crystal of the present invention will now be described.

Nb, Se, Ta and S having a high purity (99.99%) were used as raw materials. A reaction between a transition metal element and a chalcogen element selected from the above raw materials was induced at a constant temperature range (700 to 800° C.) equal to or greater than a melting point of the chalcogen element, under reduced pressure in a reaction chamber.

A silica tube was used as the reaction chamber. An atmosphere in the reaction chamber was set to have a temperature gradient ranging from about 50 to 100° C., and maintained in a nonequilibrium state under the temperature gradient. In these conditions, the chalcogen element excessively contained in the atmosphere was formed as micro-droplets repeatedly condensed/vaporized or formed/vanished and circulated around the atmosphere.

Micro-whisker crystals of a transition-metal chalcogenide formed by the reaction under the above atmosphere conditions were brought into contact with the chalcogen-element micro-droplet, and attached onto a surface of the micro-droplet by the action of a surface tension of the micro-droplet. Then, the micro-whisker crystals were grown to a loop-shaped crystal using the surface as a template, so as to obtain a strip-shaped crystal having a ring, Mobius strip or figure-of-eight shape. The loop-shaped crystal had a ribbon-like configuration having opposite open ends, or a closed loop configuration having opposite ends joined together.

The mechanism of forming the above transition-metal chalcogenide topological crystal is dependent on the crystal structures and properties of the raw materials. This is common to Zr, Ti, Hf and W as another transition metal element, and Te as another chalcogen element. Thus, chalcogenides containing these elements can also be formed as a topological crystal by selectively determining the reaction or atmosphere conditions depending on properties of these elements, such as melting point of the chalcogen element.

The above reaction may be performed by any suitable process, such as a chemical vapor transport process or a CVD (Chemical Vapor Deposition) process, which allows the chalcogenide and the chalcogen-element droplet serving as a template to be formed in a vapor phase.

INDUSTRIAL APPLICABILITY

The topological crystal formed by the method of the present invention can maintain original properties of a transition-metal chalcogenide in its 3-dimensional configuration. Thus, the topological crystal is expected as a useful functional material applicable to various devices, such as SQUID and future quantum devices, based on peculiar properties thereof.

What is claimed is:

1. A crystal having a topological structure, which comprises chalcogenide containing either one of Group IVb, Vb and VIb transition metal elements, and has a loop configuration formed by using as a template a spherical surface of a droplet of a chalcogen element, said loop configuration having a twist of n π, wherein n is an integer number selected from 0, 1 and 2.

2. The crystal as defined in claim 1, which has a ribbon-shaped open loop configuration or a closed loop configuration.

3. The crystal as defined in claim 1, wherein said chalcogen element is one selected from the group consisting of S, Se and Te, and said either one of Group IVb, Vb and VIb, transition metal elements is one selected from the group consisting of Nb, Ta, Zr, Ti, Hf and W.

4. The crystal as defined in claim 1, wherein said twist in said topological structure is formed by a crystalline disclination.

5. A method for forming a transition-metal chalcogenide crystal having a topological structure, comprising growing a transition-metal chalcogenide crystal along a surface of a micro-droplet of a chalcogen element in an atmosphere containing either one of Group IVb, Vb and VIb transition metal elements together with said chalcogen element, in such a manner as to be formed as a loop-shaped crystal wound around the surface of said micro-droplet and having a twist of n π, wherein n is an integer number selected from 0, 1 and 2.

6. The method as defined in claim 5, which includes maintaining said atmosphere in a given temperature range around a melting point of said chalcogen element and in a given temperature gradient, to allow said chalcogen-element micro-droplet to be condensed from said atmosphere, and circulating said chalcogen-element micro-droplet in a non-equilibrium state to allow micro-whiskers of a transition metal chalcogenide formed in said atmosphere to be attached onto the surface of said chalcogen-element micro-droplet by the action of a surface tension of said micro-droplet and grown as said loop-shaped crystal.

7. The method as defined in claim 5, wherein said loop-shaped crystal has a ribbon-shaped open loop configuration or a closed loop configuration.

8. The method as defined in claim 5, wherein said chalcogen element is one selected from the group consisting of S, Se and Te, and said either one of Group IVb, Vb and VIb transition metal elements is one selected from the group consisting of Nb, Ta, Zr, Ti, Hf and W.

* * * * *